(12) United States Patent
Huang et al.

(10) Patent No.: US 8,519,277 B2
(45) Date of Patent: Aug. 27, 2013

(54) SURFACE MOUNTED ELECTRONIC COMPONENT

(75) Inventors: Yi-Min Huang, Hsinchu (TW); Tsung-Chan Wu, Tainan County (TW)

(73) Assignee: Cyntec Co., Ltd., Hsinchu (TW)

( * ) Notice: Subject to any disclaimer, the term of this patent is extended or adjusted under 35 U.S.C. 154(b) by 253 days.

(21) Appl. No.: 12/860,237

(22) Filed: Aug. 20, 2010

(65) Prior Publication Data

US 2011/0048797 A1    Mar. 3, 2011

(30) Foreign Application Priority Data

Aug. 25, 2009 (TW) ................................ 98128570 A

(51) Int. Cl.
*H01L 23/48* (2006.01)
(52) U.S. Cl.
USPC .......................... 174/534; 257/779; 174/557
(58) Field of Classification Search
USPC .................... 174/534, 557; 257/693, 779
See application file for complete search history.

(56) References Cited

U.S. PATENT DOCUMENTS

| | | | | |
|---|---|---|---|---|
| 5,901,046 | A * | 5/1999 | Ohta et al. | 361/760 |
| 6,707,680 | B2 * | 3/2004 | Schaper | 361/760 |
| 2009/0071711 | A1 * | 3/2009 | Takano et al. | 174/527 |

FOREIGN PATENT DOCUMENTS

| | | |
|---|---|---|
| CN | 1311909 | 9/2001 |
| CN | 1866415 | 11/2006 |
| CN | 1989578 | 6/2007 |
| CN | 101091312 | 12/2007 |
| CN | 200986985 | 12/2007 |
| JP | 200431934 | 1/2004 |

OTHER PUBLICATIONS

"First Office Action of China Counterpart Application", issued on Nov. 15, 2011, p. 1-p. 5.
"Second Office Action of China Counterpart Application", issued on Jun. 19, 2012, p. 1-p. 8.
"Office Action of Taiwan counterpart application" issued on Apr. 30, 2013, p1-p7, in which the listed references were cited.

* cited by examiner

*Primary Examiner* — Hung Ngo
(74) *Attorney, Agent, or Firm* — J.C. Patents

(57) ABSTRACT

A surface mounted electronic component is provided. The surface mounted electronic component includes a main body, a circuit element, a conductive electrode, and a virtual electrode. The circuit element is arranged in the main body. The conductive electrode is disposed on an outer surface of the main body, wherein the conductive electrode electrically is connected to the circuit element. The virtual electrode is disposed on the outer surface of the main body, wherein the virtual electrode lies near the conductive electrode. There is a distance between the virtual electrode and the conductive electrode.

17 Claims, 11 Drawing Sheets

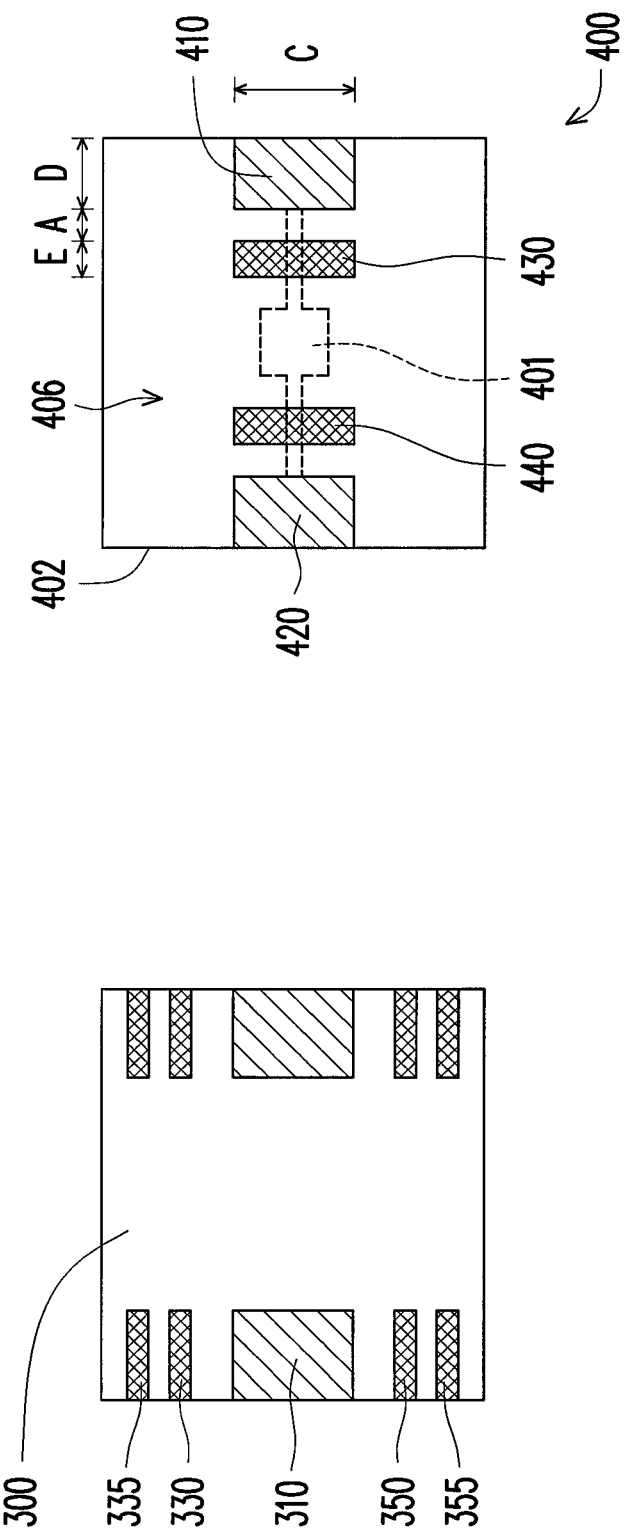

SURFACE MOUNTED ELECTRONIC COMPONENT

CROSS-REFERENCE TO RELATED APPLICATION

This application claims the priority benefit of Taiwan application serial no. 98128570, filed on Aug. 25, 2009. The entirety of the above-mentioned patent application is hereby incorporated by reference herein and made a part of this specification.

BACKGROUND

1. Field of the Invention

The invention relates to an electronic component capable of being welded to a circuit board. More particularly, the invention relates to a surface mounted electronic component.

2. Description of Related Art

To reduce sizes of electronic products, a surface mount technology (SMT) is widely applied to the present electronic products (such as computer products, home appliances, electronic toys, electronic equipments). Especially, functions of mobile electronic products such as mobile phones, personal digital assistants (PDAs), notebooks, etc., become versatile, and sizes and weights thereof become smaller and lighter. The SMT is a latest assembling and welding technique in a machining process of combining electronic components and a printed circuit board (PCB).

The assembling and welding method of the SMT is to use a solder paste screen printer to print solder paste on a pad surface of the PCB, and then uses a mounter to mount surface mount devices (SMDs) to the pads. The SMDs include resistors, capacitors, inductors, diodes, transistors and/or integrated circuits (ICs), etc. A hot air reflow process is performed to the PCB mounted with the solder paste and the SMDs to melt the solder paste, so as to combine the SMDs and the pads of the PCB, and now the assembling and the welding are completed.

To cope with requirement of lightness, slimness, shortness and smallness of the electronic products, an assembling density of the devices on the PCB is increased. To avoid a problem of mount offset, etc., an assembling precision of the SMDs is highly required. To cope with a requirement of the assembling precision, a size of a conductive electrode of a general SMD is required to comply with a size of the pad on the PCB. FIG. 1A and FIG. 1B are diagrams illustrating pads of different sizes matched to the corresponding sizes of conductive electrodes. Referring to FIG. 1A, if pads 111 on a PCB 110 of a certain client are designed to have a large size, an SMD 120 must have relatively large conductive electrodes 121. Referring to FIG. 1B, if pads 131 on a PCB 130 of another certain client are designed to have a small size, an SMD 140 must have relatively small conductive electrodes 141 even if the SMD 120 and the SMD 140 have a same device size (for example, 3 mm×3 mm) or a same characteristic specification (for example, the SMDs are all resistors of 1 mΩ). Namely, regarding the SMDs having the same device size or characteristic specification, the SMDs having different sizes of the conductive electrode have to be designed and manufactured according to different pad sizes required by different clients.

Conventionally, if the SMD with a single type of package is welded to the pads of different sizes, the SMD is probably slid in case that the solder paste is melted, which may cause problems of inaccurate alignment and unstable welding, etc., so that the assembling precision cannot be satisfied. For example, if the SMD 140 of FIG. 1B is welded on the pads 111 of FIG. 1A, in case that the solder paste is melted, the relatively small conductive electrode 141 is probably slid within a range of the large pad 111. If the SMD 120 with relatively large conductive electrodes 121 of FIG. 1A is welded to the relatively small pads 131 of FIG. 1B, a similar problem is also encountered.

Therefore, regarding the conventional technique, a manufacturer requires to design and manufacture a plurality of types of SMDs with different conductive electrode specifications, so as to match the pads of different sizes. Since the SMDs of the same characteristic specification must have different conductive electrode specifications, a production control thereof is complicated. Moreover, to satisfy client's design requirements of different pad sizes, the SMDs of different conductive electrode specifications have to be stocked, which may increase an inventory cost.

SUMMARY

The invention is directed to a surface mounted electronic component, which can be welded to pads of different sizes and geometric shapes.

The invention provides a surface mounted electronic component including a main body, a circuit element, a conductive electrode, and a first virtual electrode. The circuit element is arranged in the main body. The conductive electrode is disposed on an outer surface of the main body, wherein the conductive electrode is electrically connected to the circuit element. The first virtual electrode is disposed on the outer surface of the main body, wherein the first virtual electrode is located near the conductive electrode. There is a distance between the first virtual electrode and the conductive electrode.

The invention provides an electronic component adapted to be mounted to a circuit board having pads of different sizes through a surface mount technology (SMT). The electronic component includes a main body, a circuit element, a pair of conductive electrodes, and a pair of first virtual electrodes. The main body has a lower surface. The circuit element is arranged in the main body. The pair of conductive electrodes are disposed at two sides of the lower surface of the main body, wherein the conductive electrodes are electrically connected to the circuit element. The first virtual electrodes are disposed on the lower surface of the main body, wherein each of the first virtual electrode is located near one of the conductive electrodes. There is a distance between the first virtual electrode and the conductive electrode.

In an embodiment of the invention, positions of the conductive electrode and the first virtual electrode correspond to a geometric shape of a first pad of the circuit board, so that the conductive electrode and the first virtual electrode are all welded to the first pad.

In an embodiment of the invention, the positions of the conductive electrode and the first virtual electrode correspond to a geometric shape of a second pad of the circuit board, so that when the conductive electrode is welded to the second pad, the first virtual electrode is located outside the second pad.

According to the above descriptions, the surface mounted electronic component of the invention can be applied to a printed circuit board having different pad sizes, so as to reduce a difficulty of production control and reduce an inventory cost. Moreover, an assembling precision of the surface mounted electronic component and the printed circuit board can be increased, so as to avoid a problem of mount offset.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3E is a diagram illustrating a surface mounted electronic component according to an embodiment of the invention.

FIGS. 4A-4C are diagrams illustrating a surface mounted electronic component according to a third embodiment of the invention.

DETAILED DESCRIPTION OF DISCLOSED EMBODIMENTS

Figure 1A:
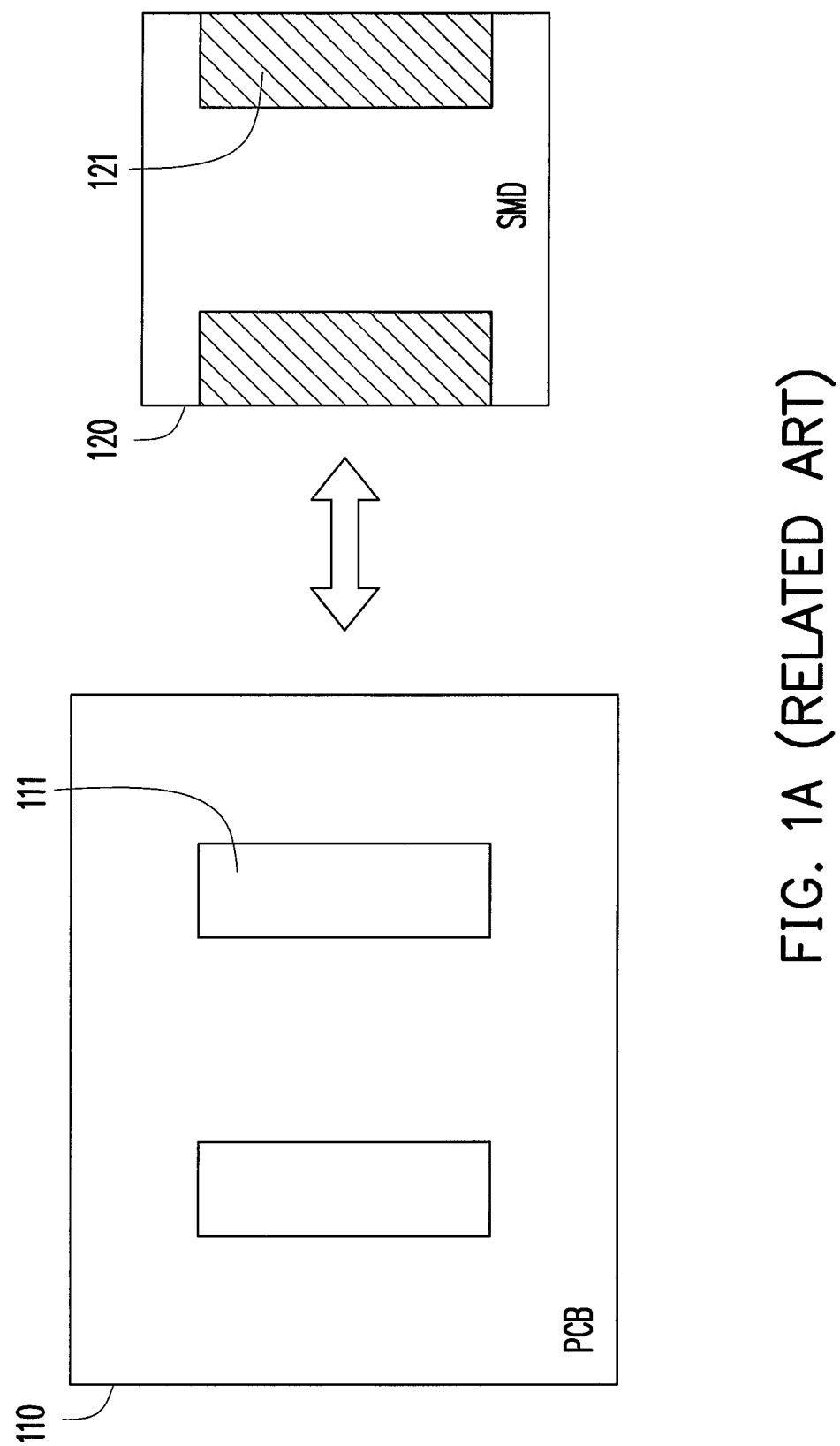
FIG. 1A and FIG. 1B are diagrams illustrating pads of different sizes matched to corresponding sizes of conductive electrodes.
Figure 1B:
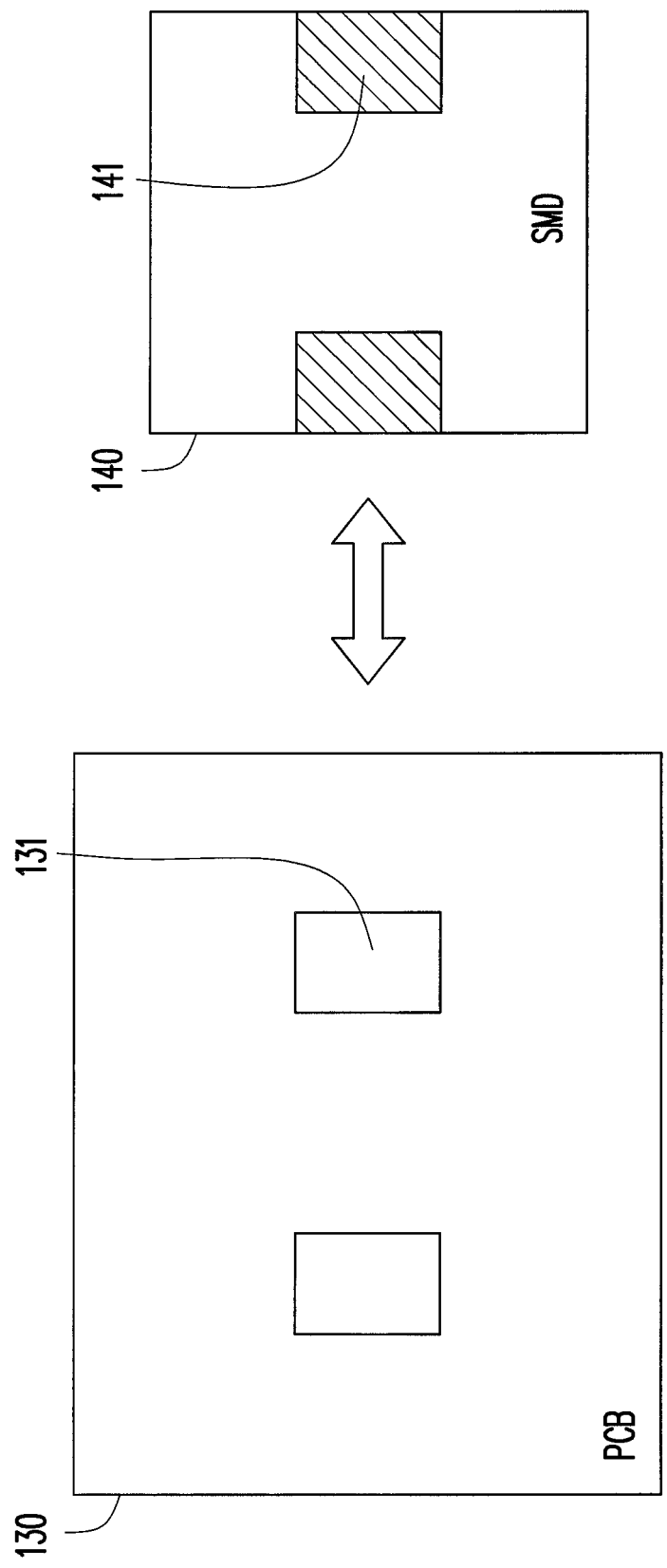
Figure 2A:
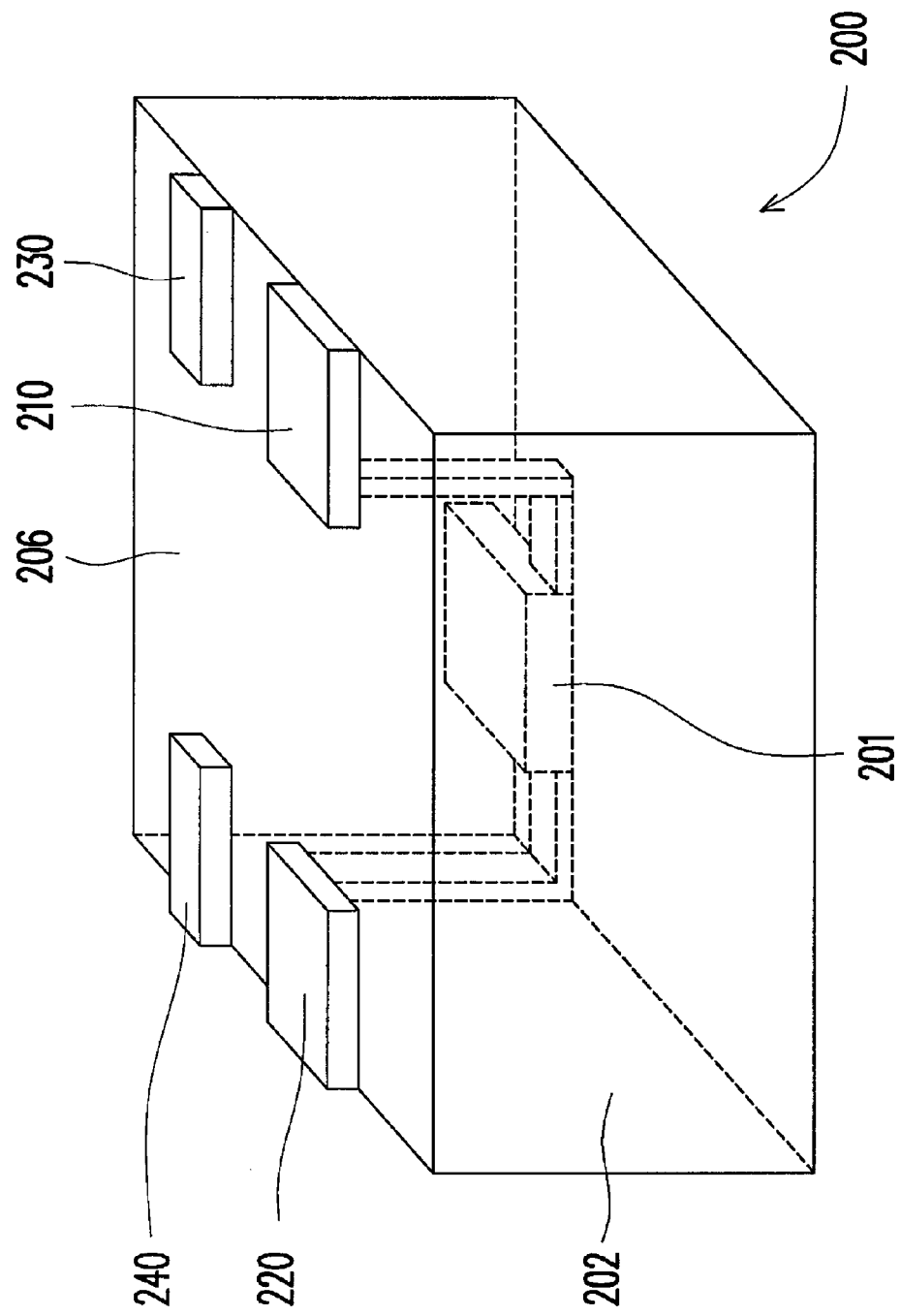
FIGS. 2A-2C are diagrams illustrating a surface mounted electronic component according to a first embodiment of the invention.
Figure 2B:
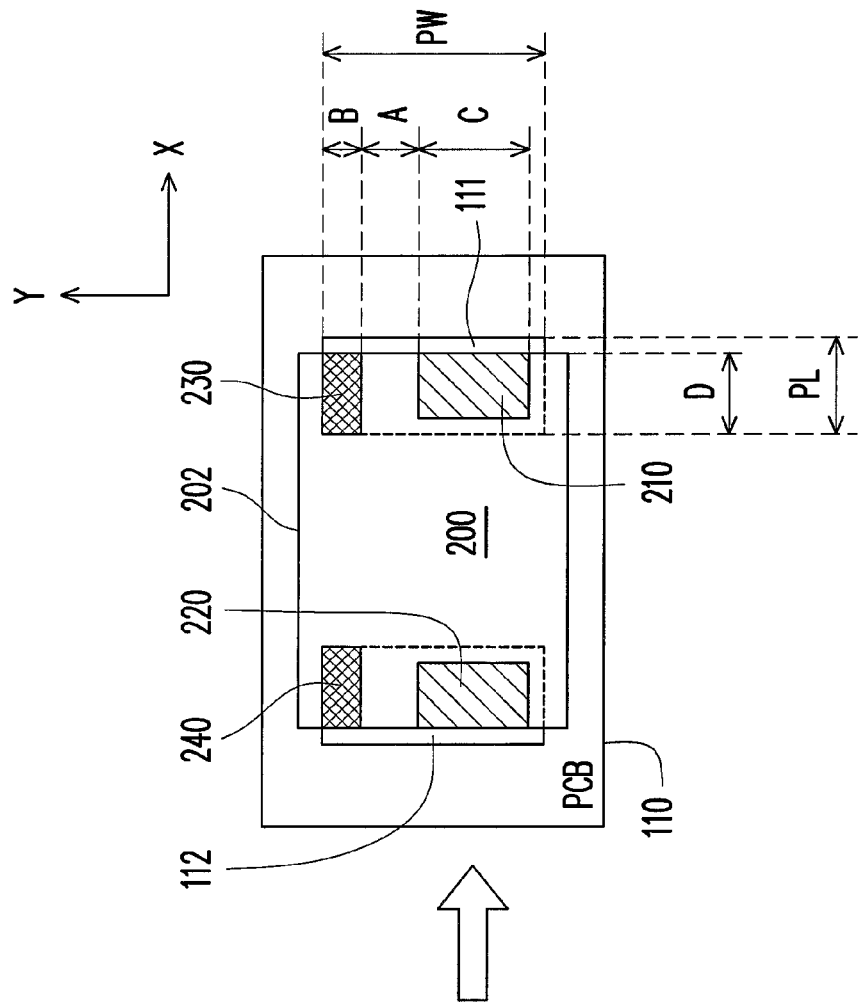
Figure 2B:
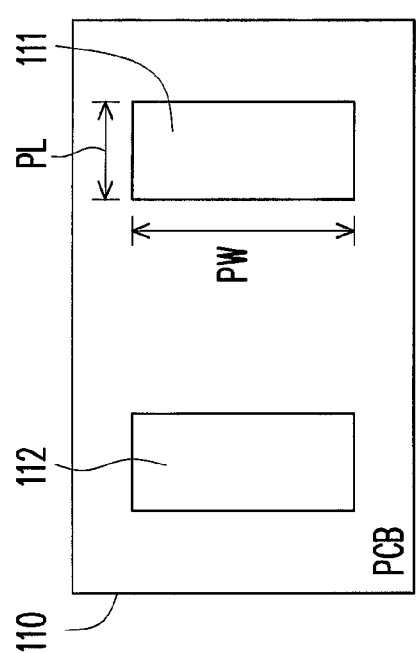
Figure 2C:
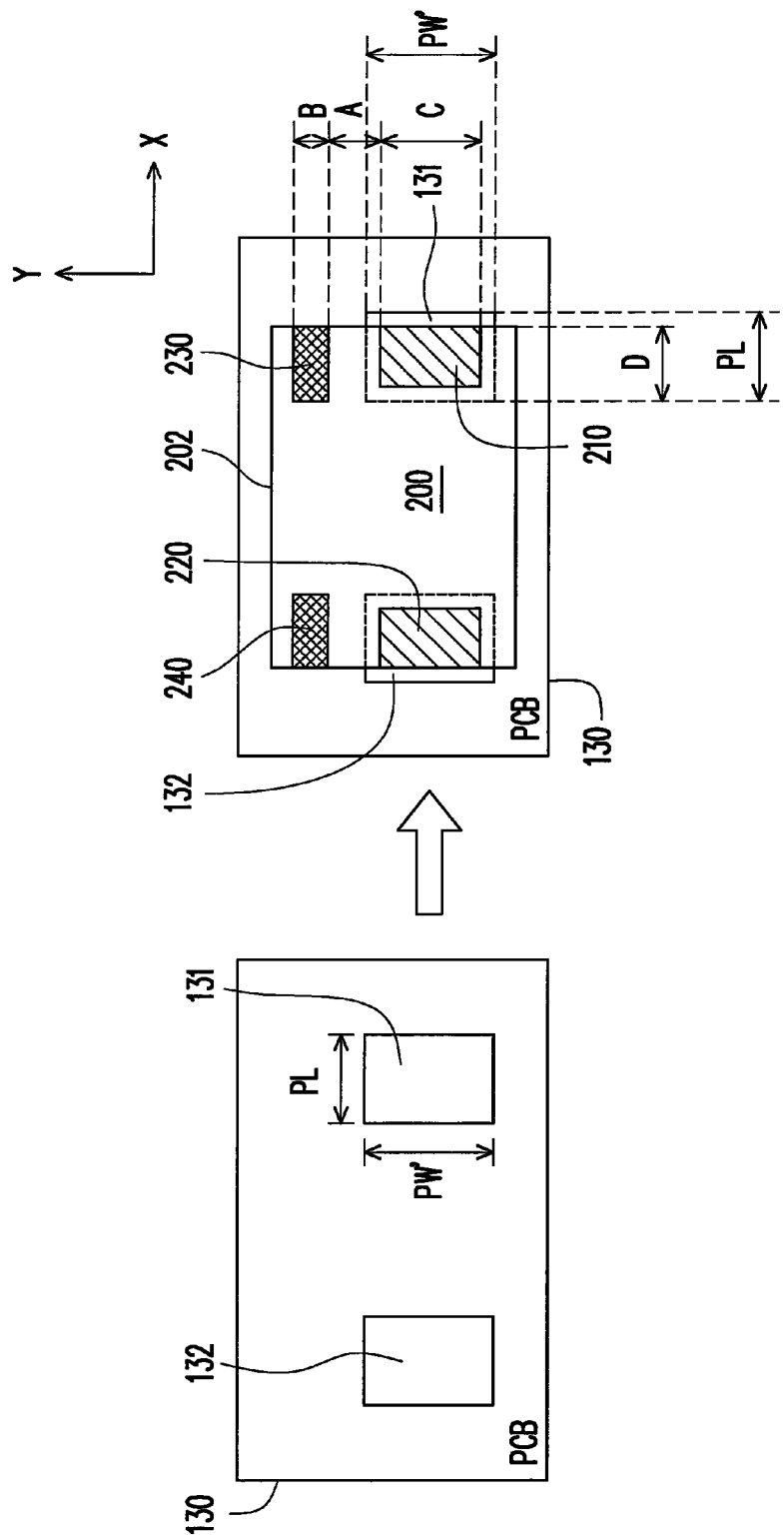

FIGS. 2A-2C are diagrams illustrating a surface mounted electronic component according to a first embodiment of the invention. The surface mounted electronic component 200 of FIG. 2A includes a main body 202, a circuit element 201, conductive electrodes 210 and 220, and first virtual electrodes 230 and 240. It should be noticed that to clearly introduce the feature of the present embodiment, the surface mounted electronic component (for example, an inductor, a capacitor, a resistor, etc.) having two conductive electrodes is taken as an example for description, though the invention is not limited thereto. Those skilled in the art can deduce other surface mounted electronic components having more conductive electrodes according to a description of the present embodiment.

The embodiment is described mainly based on a right part (the conductive electrode 210 and the first virtual electrode 230) of the surface mounted electronic component 200, and description of a left part (the conductive electrode 220 and the first virtual electrode 240) of the surface mounted electronic component 200 can be deduced by analogy.

Referring to FIG. 2A, the circuit element 201 is arranged in the main body 202 for providing rated functions of the surface mounted electronic component 200. For example, in case that the surface mounted electronic component 200 is a choke, the circuit element 201 can be a coil conductor or a metal sheet of a low temperature coefficient, and by disposing a metal coil in the main body 202 formed by a magnetic material, electric power can be stored in form of a magnetic field. Moreover, the conductive electrode 210 and 220 are disposed on an outer surface of the main body 202. The conductive electrodes 210 and 202 are electrically connected to the circuit element 201, respectively. The first virtual electrodes 230 and 240 are disposed on the outer surface of the main body 202. Here, the conductive electrodes 210 and 220 and the first virtual electrodes 230 and 240 are disposed on a lower surface 206 of the main body 202, wherein the conductive electrode 210 and the first virtual electrode 230 are disposed at the right side of the lower surface 206 of the main body 202, and the conductive electrode 220 and the first virtual electrode 240 are disposed at the left side of the lower surface 206 of the main body 202, so as to facilitate welding to a printed circuit board (not shown). Wherein, materials of the conductive electrodes 210 and 220 and the first virtual electrodes 230 and 240 are the same, which are, for example, silver or tin, etc. In other embodiment, the material of the first virtual electrodes 230 and 240 can be different to that of the conductive electrodes 210 and 220, for example, the conductive electrodes 210 and 220 are formed by a plated copper and nickel-tin layer, and the first virtual electrodes 230 and 240 are formed by a silver layer or a solder layer.

The first virtual electrode 230 is located near the conductive electrode 210, and there is a distance A between the first virtual electrode 230 and the conductive electrode 210. Those skilled in the art can determine a value of the distance A according to an actual design requirement. By suitably determining the value of the distance A, a situation that the conductive electrode 210 is welded to connect the first virtual electrode 230 due to an excessively close distance there between can be prevented. For example, the distance A is not less than 0.09 mm, and preferably the distance A is not less than 0.2 mm. Deduced by analogy, the first virtual electrode 240 is located near the conductive electrode 220, and there is also a distance A between the first virtual electrode 240 and the conductive electrode 220. In the present embodiment, if a size of the lower surface 206 of the surface mounted electronic component 200 is 3 mm×3 mm, the distance A can be between 0.09 mm and 0.8 mm. The distance A can also be between 0.2 mm and 0.5 mm according to a size design of the pads on the circuit board.

Those skilled in the art can determine whether the first virtual electrode 230 is electrically connected to the conductive electrode 210 and whether the first virtual electrode 240 is electrically connected to the conductive electrode 220 according to an actual design requirement. In the present embodiment, the first virtual electrode 230 is electrically isolated from the circuit element 201 and the conductive electrode 210. In other embodiments, if the first virtual electrode 230 is electrically connected to the conductive electrode 210, an effect of the present embodiment can also be achieved.

Positions of the conductive electrode 210 and the first virtual electrode 230 correspond to a geometric shape of a pad (not shown) of the circuit board. Therefore, when the surface mounted electronic component 200 is welded to a large pad of the circuit board, the conductive electrode 210 and the first virtual electrode 230 are all welded to the same large pad. When the surface mounted electronic component 200 is welded to a small pad of the circuit board, the positions of the conductive electrode 210 and the first virtual electrode 230 also correspond to a geometric shape of the small pad, so that when the conductive electrode 210 is welded to the small pad, the first virtual electrode 230 is located outside the small pad. Examples of FIG. 2B and FIG. 2C are used for a detailed description below.

FIG. 2B and FIG. 2C are schematic diagrams illustrating the surface mounted electronic component 200 of FIG. 2A welded to the circuit board according to an embodiment of the invention. In FIG. 2B and FIG. 2C, a left side of each diagram is a top view of the circuit board (110 or 130) without being welded by the surface mounted electronic component 200, and a right side of each diagram is a top view of the circuit board (110 or 130) welded by the surface mounted electronic component 200.

Referring to FIG. 2B, positions of the conductive electrodes 210 and 220 and the first virtual electrodes 230 and 240 respectively correspond to geometric shapes of the first pads 111 and 112 of the circuit board 110. Therefore, when the surface mounted electronic component 200 is welded to the circuit board 110, the conductive electrode 210 and the first virtual electrode 230 are all welded to the same first pad 111, and the conductive electrode 220 and the first virtual electrode 240 are all welded to the same first pad 112. Therefore, although a width C of the conductive electrode 210 is smaller than a width PW of the first pad 111, since the first virtual electrode 230 is disposed near the conductive electrode 210, and a total width from the conductive electrode 210 to the first virtual electrode 230 (a sum of the width C of the conductive electrode 210, the distance A and a width B of the first virtual electrode 230) is approximately equal to the width PW of the first pad 111, sliding of the conductive electrode 210 within a range of the first pad 111 along a Y-axis direction in case that the solder paste is melted can be avoided. Moreover, in the present embodiment, it is also assumed that a length D of the first virtual electrode 230 is approximately equal to a length PL of the first pad 111, so that sliding of the first virtual electrode 230 within the range of the first pad 111 along an X-axis direction in case that the solder paste is melted can be avoided.

Referring to FIG. 2C, the positions of the conductive electrodes 210 and 220 and the first virtual electrodes 230 and 240 respectively correspond to geometric shapes of second pads 131 and 132 of the circuit board 130, wherein sizes of the geometric shapes of the second pads 131 and 132 are smaller than that of the geometric shapes of the first pads 111 and 112 of the circuit board 110 (shown in FIG. 2B). Therefore, when the surface mounted electronic component 200 is welded to the circuit board 130, the conductive electrode 210 is welded to the second pad 131, and the first virtual electrode 230 is located outside the second pad 131. Since the width C of the conductive electrode 210 is approximately smaller than or equal to a width PW' of the second pad 131, sliding of the conductive electrode 210 within a range of the second pad 131 along the Y-axis direction in case that the solder paste is melted can be avoided. Although the surface mounted electronic component 200 has the first virtual electrode 230, since there is the distance A between the conductive electrode 210 and the first virtual electrode 230, the first virtual electrode 230 does not interfere the welding between the conductive electrode 210 and the second pad 131.

The distance A, the width B of the first virtual electrode 230, the width C of the conductive electrode 210 and the length D of the first virtual electrode 230 (or the conductive electrode 210) can be determined according to the sizes of the pads on the circuit board, so that the surface mounted electronic components of a single specification can be mounted to the pads of different sizes on the circuit board. For example, in the present embodiment, to ensure that the surface mounted electronic component 200 can be mounted to both of the circuit board 110 having the first pad 111 and the circuit board 130 having the second pad 131, and ensure an assembling precision and avoid a mount offset, widths of the components of the surface mounted electronic component 200 and the width of the pad on the circuit boards are required to satisfy a following equation (1): the distance A≦(the width PW of the first pad–the width C of the conductive electrode–the width B of the first virtual electrode), and a following equation (2): the distance A≧(the width PW' of the second pad–the width C of the conductive electrode).

Figure 3B:
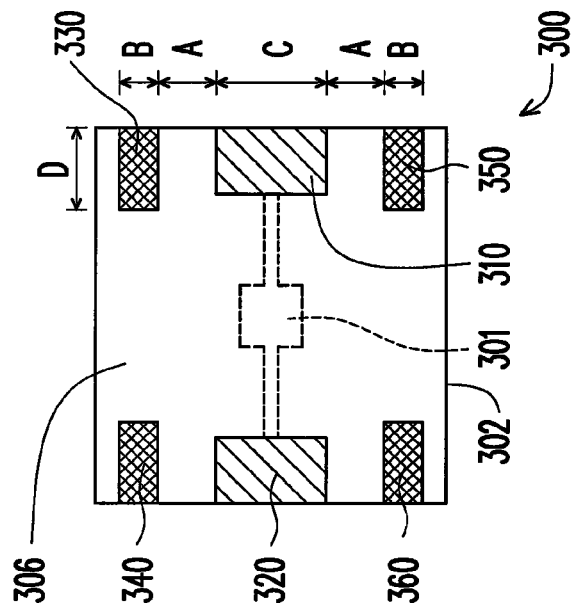
FIGS. 3A-3D are diagrams illustrating a surface mounted electronic component according to a second embodiment of the invention.
Figure 3A:
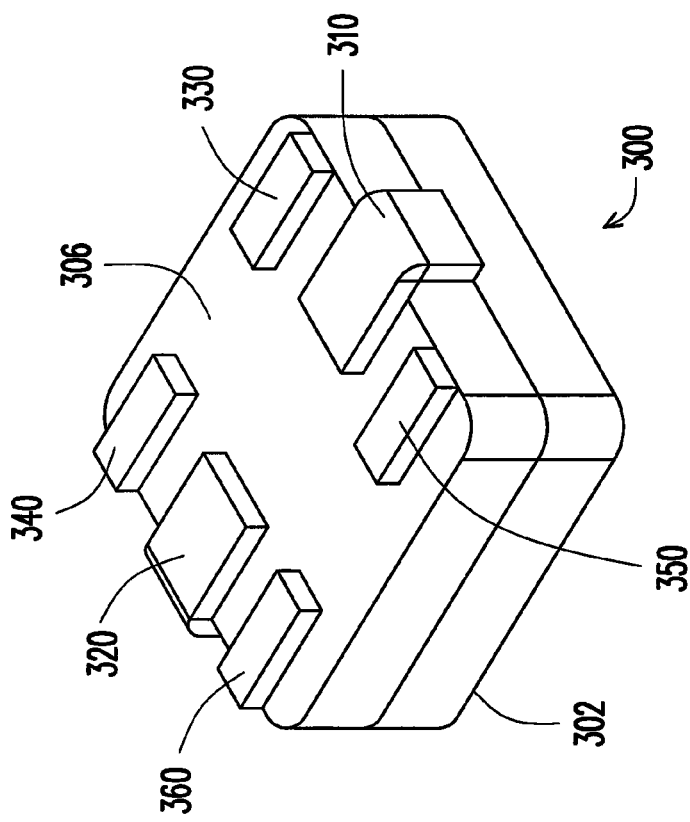

FIGS. 3A-3D are diagrams illustrating a surface mounted electronic component according to a second embodiment of the invention. FIG. 3A is a three-dimensional view of the surface mounted electronic component 300, and FIG. 3B is a top view of the surface mounted electronic component 300. A difference between the second embodiment and the first embodiment is that the surface mounted electronic component 300 further includes second virtual electrodes 350 and 360, and the second virtual electrodes 350 and 360 and first virtual electrodes 330 and 340 are respectively disposed at two sides of conductive electrodes 310 and 320. For simplicity's sake, the components (for example, a main body 302, a lower surface 306, a circuit element 301, the conductive electrodes 310 and 320, and the first virtual electrodes 330 and 340, etc.) in the second embodiment that are similar or the same to that of the first embodiment are represented by similar or the same reference numbers, and the related descriptions thereof are not repeated.

Referring to FIG. 3B, in the present embodiment, the conductive electrodes 310 and 320, the first virtual electrodes 330 and 340, and the second virtual electrodes 350 and 360 are all disposed on the lower surface 306 of the main body 302. There is the distance A between the first virtual electrode 330 and the conductive electrode 310, and there is also the distance A between the second virtual electrode 350 and the conductive electrode 310. It should be noticed that although the first virtual electrode 330 and the second virtual electrode 350 are symmetrically disposed at two sides of the conductive electrode 310 to form the same distance A, the invention is not limited thereto, and the distances respectively between the first virtual electrode 330, the second virtual electrode 350 and the conductive electrode 310 can also be different, and those skilled in the art can determine a value of the distance A according to an actual design requirement. In the present embodiment, the distance A is between 0.2 mm and 0.5 mm, so as to ensure that the first virtual electrode 330 and the second virtual electrode 350 are not welded to connect the conductive electrode 310 due to excessive close distance.

Figure 3C:
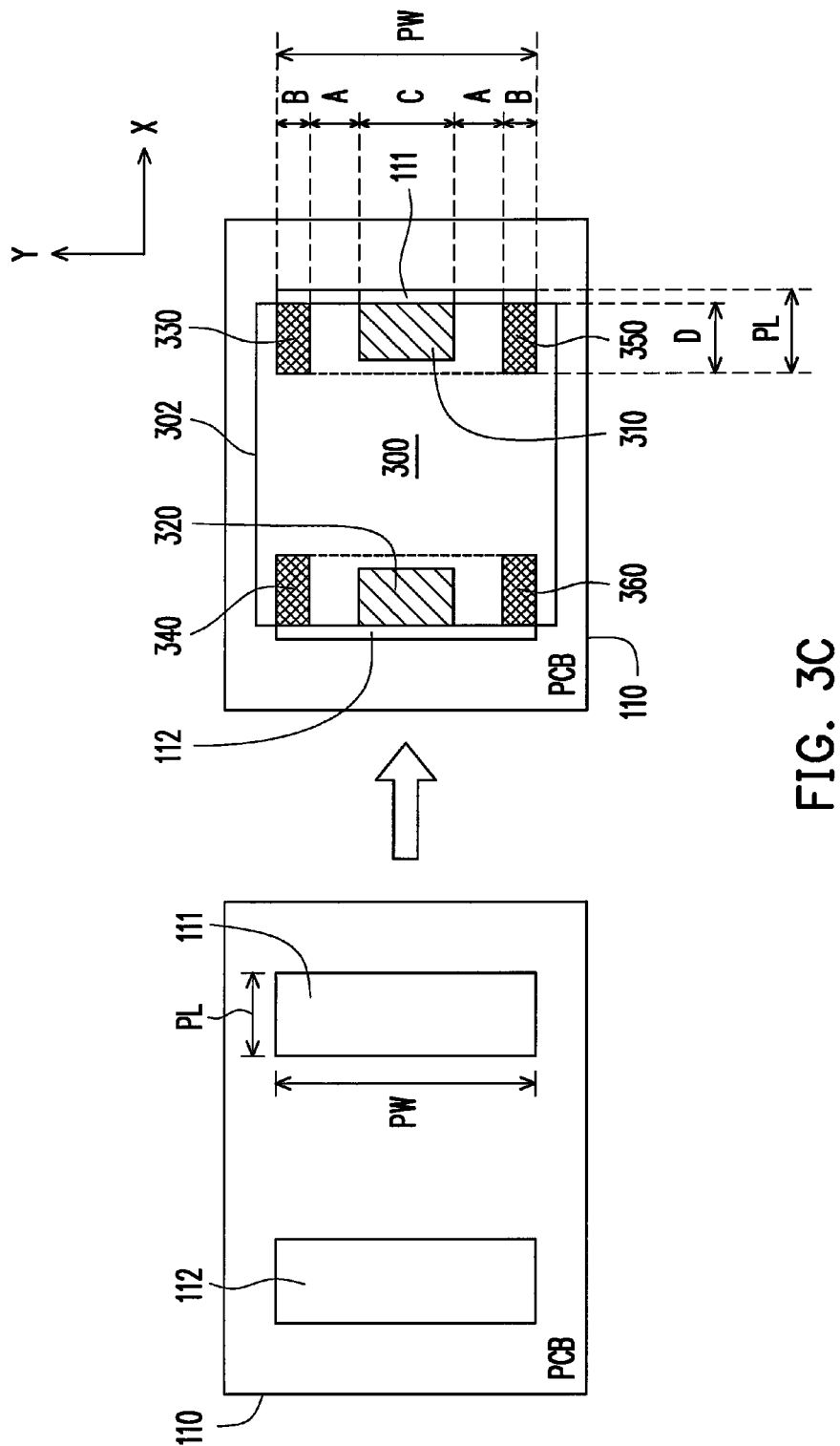
Figure 3D:
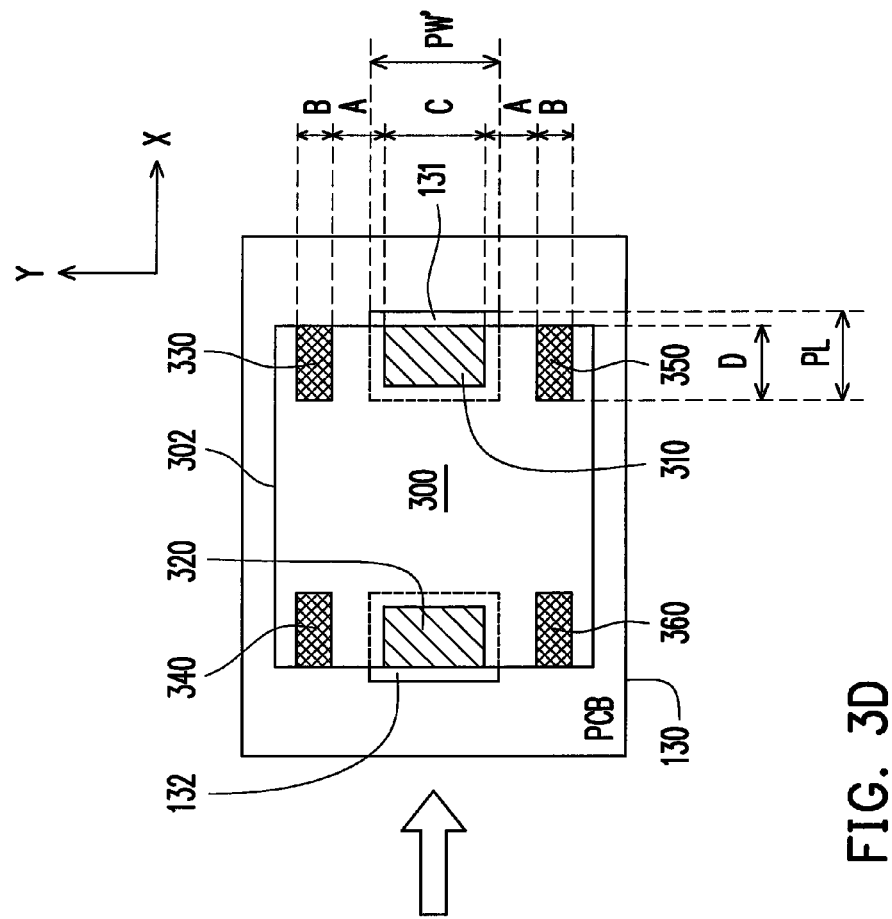

FIGS. 3C and 3D are schematic diagrams illustrating the surface mounted electronic component 300 of FIG. 3A and FIG. 3B welded to the circuit board according to an embodiment of the invention. In FIG. 3C and FIG. 3D, a left side of each diagram is a top view of the circuit board without being welded by the surface mounted electronic component 300, and a right side of each diagram is a top view of the circuit board welded by the surface mounted electronic component 300. The embodiment is described mainly based on a right part (the conductive electrode 310, the first virtual electrode 330 and the second virtual electrode 350) of the surface mounted electronic component 300, and description of a left part (the conductive electrode 320, the first virtual electrode 340 and the second virtual electrode 360) of the surface mounted electronic component 300 can be deduced by analogy.

Referring to FIG. 3C, positions of the conductive electrode 310, the first virtual electrode 330 and the second virtual electrode 350 correspond to the geometric shape of the first pad 111 of the circuit board 110. In the present embodiment, positions of the conductive electrode 310, the first virtual electrode 330 and the second virtual electrode 350 are aligned in a straight line, and the first virtual electrode 330 and the second virtual electrode 350 are symmetrically disposed at two sides of the conductive electrode 310. Therefore, when the surface mounted electronic component 300 is welded to the circuit board 110, the conductive electrode 310, the first virtual electrode 330 and the second virtual electrode 350 are all welded to the same first pad 111. Although a width C of the conductive electrode 310 is smaller than the width PW of the first pad 111, since the first and the second virtual electrodes 330 and 350 are disposed near the conductive electrode 310, and a total width from the first virtual electrode 330 to the second virtual electrode 350 (a sum of a width B of the first virtual electrode 330, the distance A, the width C of the conductive electrode 310, the distance A and the width B of the second virtual electrode 350) is approximately equal to the width PW of the first pad 111, sliding of the conductive electrode 310 within a range of the first pad 111 along the Y-axis direction in case that the solder paste is melted can be avoided. Moreover, in the present embodiment, it is also assumed that a length D of the first and the second virtual electrode 330 and 350 is approximately equal to the length PL of the first pad 111, so that sliding of the first and the second virtual electrode 330 and 350 within the range of the first pad 111 along the X-axis direction in case that the solder paste is melted can be avoided.

Referring to FIG. 3D, the positions of the conductive electrode 310, the first virtual electrode 330 and the second virtual electrode 350 correspond to a geometric shape of second pad 131 of the circuit board 130. Therefore, when the surface mounted electronic component 300 is welded to the circuit board 130, the conductive electrode 310 is welded to the second pad 131, and the first and the second virtual electrode 330 and 350 are located outside the second pad 131. Since the width C of the conductive electrode 310 is approximately equal to a width PW' of the second pad 131, sliding of the conductive electrode 310 within a range of the second pad 131 along the Y-axis direction in case that the solder paste is melted can be avoided. Moreover, since the length of the conductive electrode 310 is approximately equal to the length PL of the second pad 131, sliding of the conductive electrode 310 within a range of the second pad 131 along the X-axis direction in case that the solder paste is melted can be avoided. Although the surface mounted electronic component 300 has the first and the second virtual electrodes 330 and 350, since there is the distance A respectively between the conductive electrode 310 and the first and the second virtual electrodes 330 and 350, the first and the second virtual electrodes 330 and 350 do not interfere the welding between the conductive electrode 310 and the second pad 131.

The distance A, the widths B of the first and the second virtual electrode 330 and 350, the width C of the conductive electrode 310 and the length D of the first and/or the second virtual electrode 330 and/or 350 (or the conductive electrode 310) can be determined according to the sizes of the pads on the circuit board, so that the surface mounted electronic components of a single specification can be mounted to the pads of different sizes on the circuit board. In the present embodiment, the distance A satisfies a following equation: (the width PW' of the second pad−the width C of the conductive electrode)≦the distance A≦(the width PW of the first pad−the width C of the conductive electrode−the width B of the first virtual electrode−the width B of the second virtual electrode)/2.

Those skilled in the art can change positions and a number of the electrodes of FIG. 3A (or FIG. 3B) according to an actual design requirement. If the circuit board has pads of three different widths of large, medium and small, the surface mounted electronic component 300 of FIG. 3A may further have a third virtual electrode 335 and a fourth virtual electrode 355 (referring to FIG. 3E), wherein the third virtual electrode 335 and the fourth virtual electrode 355 can be disposed at edges of the right side of the lower surface 306 of the surface mounted electronic component 300 with reference of the first virtual electrode 330 and the second virtual electrode 350, and the electrodes are arranged in a sequence of the third virtual electrode 335, the first virtual electrode 330, the conductive electrode 310, the second virtual electrode 350 and the fourth virtual electrode 355. There is the distance A between the third virtual electrode 335 and the first virtual electrode 330, and there is also the distance A between the second virtual electrode 350 and the fourth virtual electrode 355. Therefore, when the conductive electrode 310 is welded to a large pad, the third virtual electrode 335, the first virtual electrode 330, the conductive electrode 310, the second virtual electrode 350 and the fourth virtual electrode 355 are all welded to the same large pad. When the conductive electrode 310 is welded to a medium pad, the first virtual electrode 330, the conductive electrode 310 and the second virtual electrode 350 are all welded to the same medium pad, and the third virtual electrode 335 and the fourth virtual electrode 355 are located outside the medium pad. When the conductive electrode 310 is welded to a small pad, the conductive electrode 310 is welded to the small pad, and the first to the fourth virtual electrodes 330, 350, 335 and 355 are all located outside the small pad.

Figure 4B:
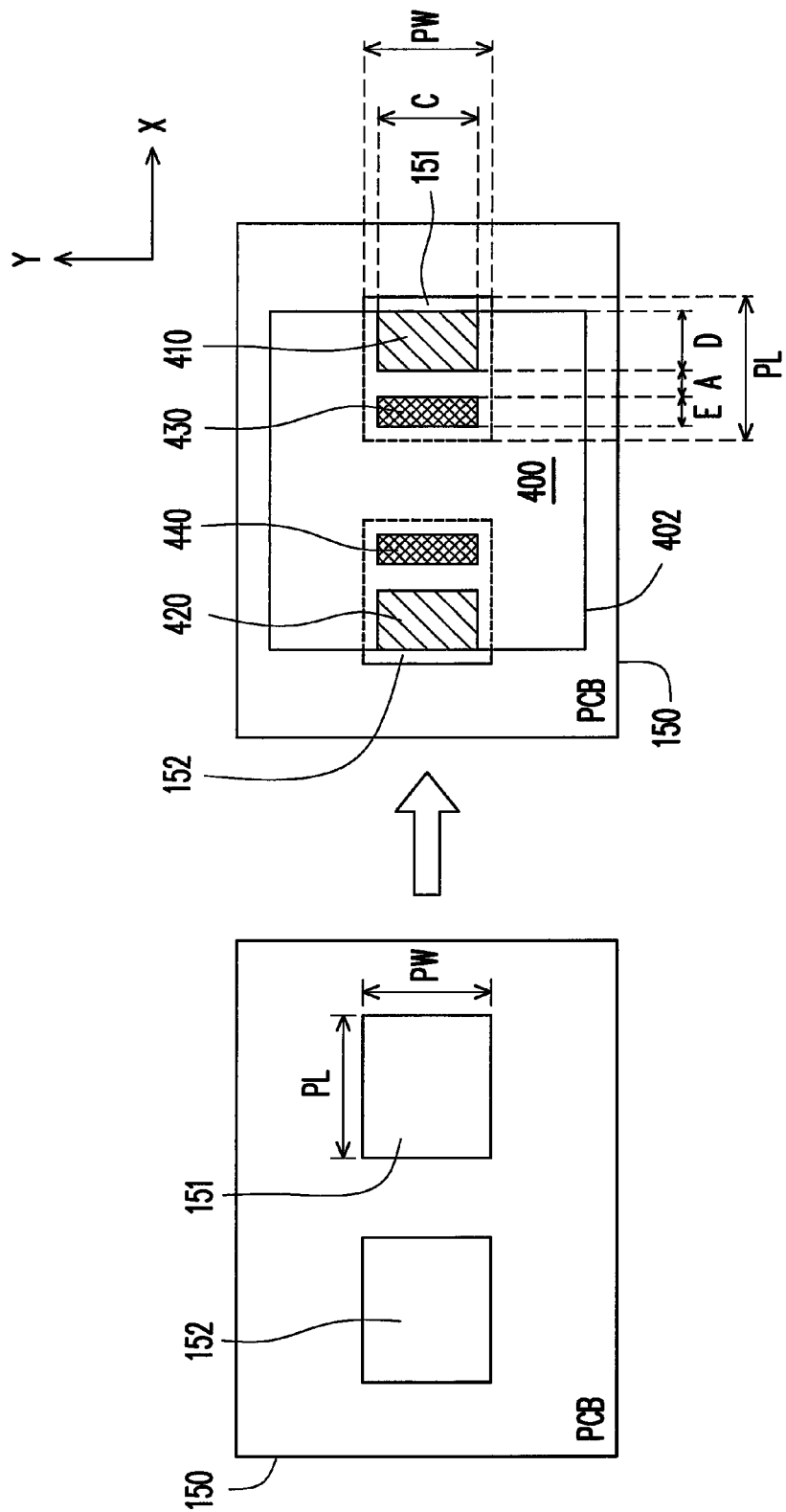
Figure 4C:
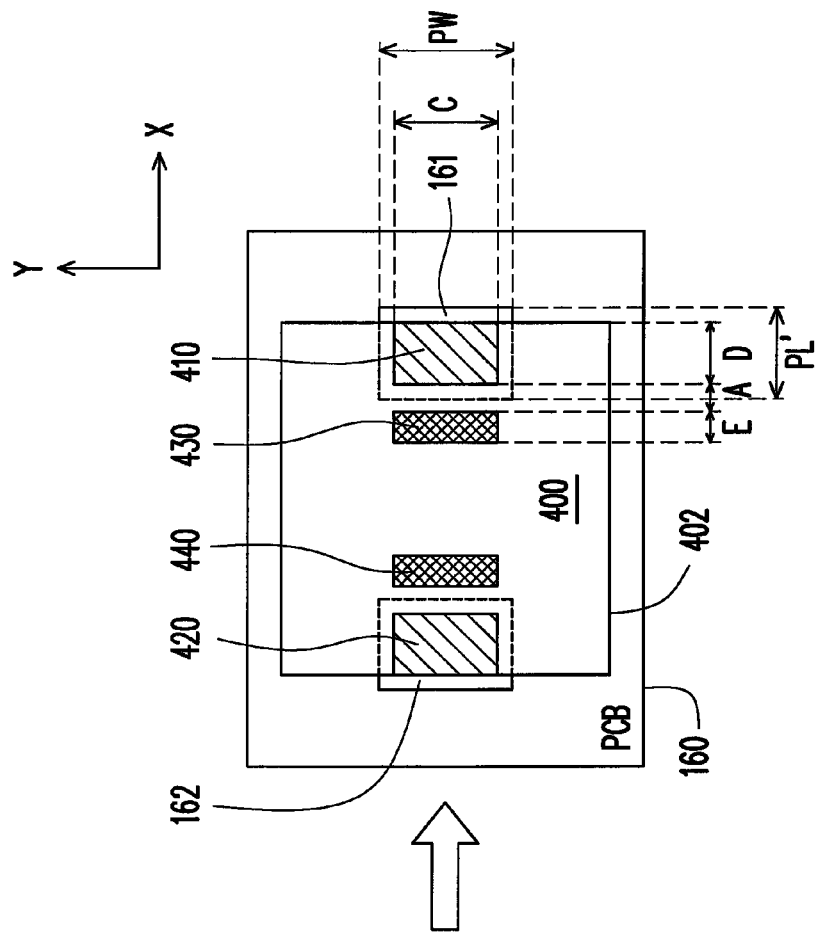
Figure 4C:
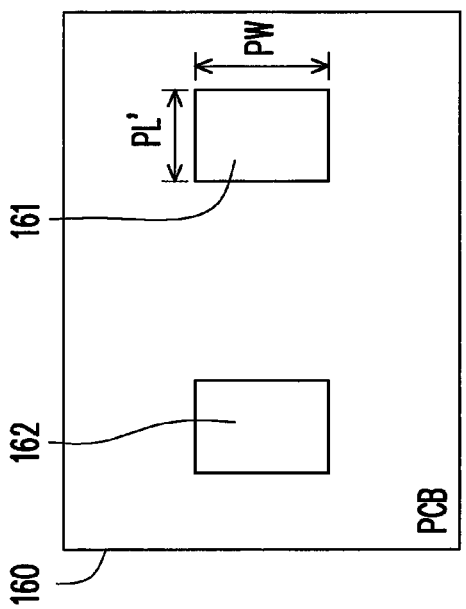

FIGS. 4A-4C are diagrams illustrating a surface mounted electronic component 400 according to a third embodiment of the invention. A difference between the third embodiment and the first embodiment is that first virtual electrodes 430 and 440 are located between two conductive electrodes 410 and 420. For simplicity's sake, the components (for example, a main body 402, a lower surface 406, a circuit element 401, the conductive electrodes 410 and 420, and the first virtual electrodes 430 and 440, etc.) in the third embodiment that are similar or the same to that of the first embodiment are represented by similar or the same reference numbers, and the related descriptions thereof are not repeated.

Referring to FIG. 4A, in the present embodiment, the conductive electrodes 410 and 420, the first virtual electrodes 430 and 440 are all located on the lower surface 406 of the main body 402, and the first virtual electrodes 430 and 440 are respectively located between the conductive electrodes 410 and 420. There is a distance A respectively between the first virtual electrodes 430 and 440 and the conductive electrode 410 and 420. Those skilled in the art can determine a value of the distance A according to an actual design requirement. For example, the distance A is not less than 0.09 mm, and is preferably not less than 0.2 mm, so as to avoid a connection of the solder pastes due to excessive close distance there between when the solder pastes are melted. In the present embodiment, the distance A can be between 0.2 mm and 0.4 mm.

Referring to FIG. 4B and FIG. 4C, positions of the conductive electrode 420, the first virtual electrode 440, the first virtual electrode 430 and the conductive electrode 410 are aligned in a straight line along an X-axis direction, and the four electrodes all have a width of C. In the present embodiment, positions of the conductive electrodes 410 and 420 and the first virtual electrodes 430 and 440 correspond to geometric shapes of first pads 151 and 152 of the circuit board 150, and correspond to geometric shapes of second pads 161 and 162 of the circuit board 160.

Therefore, when the surface mounted electronic component 400 is welded to the circuit board 150, the conductive electrode 410 and the first virtual electrode 430 are all welded to the same first pad 151. In the present embodiment, the width C of the conductive electrode 410 and/or the first virtual electrode 430 is approximately equal to a width PW of the first pad 151, so that sliding of the conductive electrode 410 and the first virtual electrode 430 within a range of the first pad 151 along the Y-axis direction in case that the solder paste is melted can be avoided. Moreover, although a length D of the conductive electrode 410 is smaller than a length PL of the first pad 151, since the first virtual electrode 430 is disposed near the conductive electrode 410, and a total length from the first virtual electrode 430 to the conductive electrode 410 (a sum of a length E of the first virtual electrode 430, the distance A and the length D of the conductive electrode 410) is approximately equal to the length PL of the first pad 151, sliding of the conductive electrode 410 within the range of the first pad 151 along the X-axis direction in case that the solder paste is melted can be avoided.

Moreover, when the surface mounted electronic component 400 is welded to the circuit board 160, the conductive electrode 410 is welded to the second pad 161, and the first virtual electrode 430 is located outside the second pad 161 (shown in FIG. 4C). Since the length D of the conductive electrode 410 is approximately equal to a length PL' of the second pad 161, sliding of the conductive electrode 410 within the range of the second pad 161 along the X-axis direction in case that the solder paste is melted can be avoided. Moreover, since the width C of the conductive electrode 410 is approximately equal to a width PW of the second pad 161, sliding of the conductive electrode 410 within the range of the second pad 161 along the Y-axis direction in case that the solder paste is melted can be avoided. Although the surface mounted electronic component 400 has the first virtual electrode 430, since there is the distance A between the conductive electrode 410 and the first virtual electrode 430, the first virtual electrode 430 does not interfere the welding between the conductive electrode 410 and the second pad 161.

The distance A, the length E of the first virtual electrode 430, the width C of the conductive electrode 410 (or the first virtual electrode 430) and the length D of the conductive electrode 410 can be determined according to the size of the pad on the circuit board. In the present embodiment, the width C of the conductive electrode 410 is between 0.8 mm and 1.1 mm, the length E of the first virtual electrode 430 is between 0.2 mm and 0.4 mm. Moreover, a difference between the width PW of the second pad 161 and the width C of the conductive electrode 410 is between 0 mm and 0.8 mm, and a difference between the length PL' of the second pad 161 and the length D of the conductive electrode 410 is between 0 mm and 0.8 mm.

In summary, those skilled in the art can determine the positions, sizes and a number of the virtual electrodes according to an actual design requirement, so that the surface mounted electronic component using the virtual electrodes can be applied to pads of different sizes and geometric shapes, so as to reduce a difficulty of production control and reduce an inventory cost. Moreover, an assembling precision of the surface mounted electronic component and the printed circuit board can be increased, so as to avoid a problem of mount offset.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A surface mounted electronic component, comprising:
a main body;
a circuit element, arranged in the main body;
a conductive electrode, disposed on an outer surface of the main body, wherein the conductive electrode is electrically connected to the circuit element; and
a first virtual electrode, disposed on the outer surface of the main body, wherein the first virtual electrode is located near the conductive electrode, and there is a distance between the first virtual electrode and the conductive electrode,
wherein positions of the conductive electrode and the first virtual electrode correspond to a geometric shape of a first pad of a circuit board, so that the conductive electrode and the first virtual electrode are all welded to the first pad.

2. The surface mounted electronic component as claimed in claim 1, wherein positions of the conductive electrode and the first virtual electrode correspond to a geometric shape of a second pad of a circuit board, so that when the conductive electrode is welded to the second pad, the first virtual electrode is located outside the second pad.

3. The surface mounted electronic component as claimed in claim 2, wherein the distance is smaller than or equal to a width of the first pad minus widths of the conductive electrode and the first virtual electrode, and is greater than or equal to a width of the second pad minus the width of the conductive electrode.

4. The surface mounted electronic component as claimed in claim 1, further comprising a second virtual electrode disposed on the outer surface of the main body, wherein the second virtual electrode is isolated from the circuit element.

5. The surface mounted electronic component as claimed in claim 4, wherein positions of the conductive electrode, the first virtual electrode and the second virtual electrode are aligned in a straight line, and the first virtual electrode and the second virtual electrode are symmetrically disposed at two sides of the conductive electrode.

6. The surface mounted electronic component as claimed in claim 4, wherein positions of the conductive electrode, the first virtual electrode and the second virtual electrode correspond to the geometric shape of the first pad of the circuit board, so that the conductive electrode, the first virtual electrode and the second virtual electrode are all welded to the first pad.

7. The surface mounted electronic component as claimed in claim 6, wherein positions of the conductive electrode, the first virtual electrode and the second virtual electrode correspond to a geometric shape of a second pad of a circuit board, so that when the conductive electrode is welded to the second pad, the first virtual electrode and the second virtual electrode are located outside the second pad.

8. The surface mounted electronic component as claimed in claim 7, wherein the distance satisfies a following equation:

$$(PW' - C) \leq A \leq \frac{(PW - C - B - B)}{2},$$

wherein PW' represent a width of the second pad, C represent a width of the conductive electrode, A represent the distance, PW represent a width of the first pad, and B represent a width of the first virtual electrode or the second virtual electrode.

9. The surface mounted electronic component as claimed in claim 1, wherein the distance is between 0.09 mm and 0.8 mm.

10. The surface mounted electronic component as claimed in claim 1, wherein the distance is between 0.2 mm and 0.5 mm.

11. The surface mounted electronic component as claimed in claim 1, wherein the first virtual electrode is isolated from the circuit element.

12. A surface mounted electronic component, comprising:
a main body;
a circuit element, arranged in the main body;
a conductive electrode, disposed on an outer surface of the main body, wherein the conductive electrode is electrically connected to the circuit element;
a first virtual electrode, disposed on the outer surface of the main body, wherein the first virtual electrode is located near the conductive electrode, and there is a distance between the first virtual electrode and the conductive electrode; and
a second virtual electrode, disposed on the outer surface of the main body, wherein the second virtual electrode is isolated from the circuit element,
wherein positions of the conductive electrode, the first virtual electrode and the second virtual electrode are aligned in a straight line, and the first virtual electrode and the second virtual electrode are symmetrically disposed at two sides of the conductive electrode,
wherein positions of the conductive electrode, the first virtual electrode and the second virtual electrode correspond to a geometric shape of a first pad of a circuit board, so that the conductive electrode, the first virtual electrode and the second virtual electrode are all welded to the first pad.

13. The surface mounted electronic component as claimed in claim 12, wherein positions of the conductive electrode, the first virtual electrode and the second virtual electrode correspond to a geometric shape of a second pad of a circuit board, so that when the conductive electrode is welded to the second pad, the first virtual electrode and the second virtual electrode are located outside the second pad.

14. The surface mounted electronic component as claimed in claim 13, wherein the distance satisfies a following equation:

$$(PW' - C) \leq A \leq \frac{(PW - C - B - B)}{2},$$

wherein PW' represent a width of the second pad, C represent a width of the conductive electrode, A represent the distance, PW represent a width of the first pad, and B represent a width of the first virtual electrode or the second virtual electrode.

15. The surface mounted electronic component as claimed in claim 12, wherein the distance is between 0.09 mm and 0.8 mm.

16. The surface mounted electronic component as claimed in claim 12, wherein the distance is between 0.2 mm and 0.5 mm.

17. The surface mounted electronic component as claimed in claim 12, wherein the first virtual electrode is isolated from the circuit element.

* * * * *